United States Patent
Piraner et al.

(10) Patent No.: US 10,852,754 B2
(45) Date of Patent: Dec. 1, 2020

(54) PREDICTIVE VALVE CONTROL SYSTEM

(71) Applicant: The Boeing Company, Chicago, IL (US)

(72) Inventors: Alexander Piraner, Long Beach, CA (US); Son T. Vo, Huntington Beach, CA (US); Wayne Pauley, Seal Beach, CA (US)

(73) Assignee: The Boeing Company, Chicago, IL (US)

( * ) Notice: Subject to any disclaimer, the term of this patent is extended or adjusted under 35 U.S.C. 154(b) by 620 days.

(21) Appl. No.: 15/659,558

(22) Filed: Jul. 25, 2017

(65) Prior Publication Data

US 2019/0033900 A1 Jan. 31, 2019

(51) Int. Cl.
*G05D 16/20* (2006.01)
*H03K 19/177* (2020.01)
*F16K 37/00* (2006.01)
*F16K 31/06* (2006.01)
*B64G 1/62* (2006.01)

(52) U.S. Cl.
CPC .......... *G05D 16/2026* (2013.01); *B64G 1/62* (2013.01); *F16K 31/0675* (2013.01); *F16K 37/005* (2013.01); *H03K 19/177* (2013.01)

(58) Field of Classification Search
CPC .. G05D 16/2026; G05D 16/2013; B64G 1/62; B64G 1/428; B64G 2001/224; F16K 31/0675; F16K 37/005; H03K 19/177
See application file for complete search history.

(56) References Cited

U.S. PATENT DOCUMENTS

| | | | | |
|---|---|---|---|---|
| 4,504,031 A | * | 3/1985 | Andrews | B64G 1/62 244/110 D |
| 8,352,651 B2 | * | 1/2013 | Parfitt | G05B 19/054 326/37 |
| 9,646,114 B2 | | 5/2017 | Karimi et al. | |
| 2007/0012820 A1 | * | 1/2007 | Buehler | B64G 1/14 244/158.9 |
| 2008/0127065 A1 | * | 5/2008 | Bryant | G05B 19/056 717/109 |
| 2008/0265086 A1 | * | 10/2008 | Lee | B64B 1/50 244/30 |
| 2015/0254385 A1 | | 9/2015 | Chesnut et al. | |
| 2016/0265477 A1 | * | 9/2016 | Smith | B64G 1/402 |

* cited by examiner

*Primary Examiner* — Assres H Woldemaryam
(74) *Attorney, Agent, or Firm* — Kolisch Hartwell, P.C.

(57) ABSTRACT

A pressure control system may include a plurality of inflatable objects, each of the inflatable objects having a respective pressure sensor and a respective inflation valve, wherein each of the inflation valves has a behavior profile predictive of an amount of current used by the valve when operated. A valve controller of the system may have a pressure management circuit that receives information from the pressure sensors and is configured to automatically maintain a respective selected pressure in each of the inflatable objects by issuing commands to operate the inflation valves. An electrical current management circuit of the valve controller may be configured to predict, based on the valve behavior profiles, what effect the command would have on a total current usage, when executed, and automatically prevent any command that would cause the total current usage to exceed a maximum allowable current.

20 Claims, 7 Drawing Sheets

PREDICTIVE VALVE CONTROL SYSTEM

FEDERALLY SPONSORED RESEARCH AND DEVELOPMENT

The invention described herein was made in the performance of work under NASA Contract No. NNK14MA75C and is subject to the provisions of Section 305 of the National Aeronautics and Space Act of 1958 (72 Stat.435: 42U.S.C.2457).

INTRODUCTION

In certain operating environments, available electrical power is limited and must be managed properly to avoid failures and system downtime. In some such environments, direct monitoring of power consumption and electrical current may not be desirable or even feasible, e.g., due to space and/or weight constraints. For example, a spacecraft or missile may have strict weight limitations, limited space, and limited available electrical power. At the same time, systems onboard the spacecraft or missile must often act dynamically to provide desired functionality. Furthermore, these systems may include components with nonlinear electrical power profiles that change as a function of time, e.g., due to inrush current. For example, systems often include solenoid valves, actuators, motors, transformers, and the like. A solution is needed that would ensure maximum power dissipation (i.e., electrical current usage) remains below the required limit in a dynamic, potentially nonlinear, and multifaceted environment, without a dedicated feedback path or monitoring devices that would use up space and weight budgets.

SUMMARY

The present disclosure provides systems, apparatuses, and methods relating to prevention of overcurrent scenarios using predictive control systems to operate a plurality of devices in a limited power availability environment, without directly monitoring electrical current usage. In some embodiments, a pressure control system may include: a plurality of inflatable objects, each of the inflatable objects having a respective pressure sensor and a respective inflation valve, wherein each of the inflation valves is controllable electrically and has a behavior profile predictive of an amount of current used by the valve when operated; and a valve controller having a pressure management circuit that receives pressure information from the pressure sensors and is configured to automatically maintain a respective selected pressure in each of the inflatable objects by issuing commands to operate the inflation valves; wherein the valve controller further includes an electrical current management circuit configured to: predict, based on the valve behavior profiles, what effect each of the commands issued by the pressure management circuit would have on a total current usage, if executed, and automatically prevent any command that would cause the total current usage to exceed a maximum allowable current.

In some embodiments, a spacecraft may include: a spacecraft frame; a landing system coupled to the spacecraft frame and including a plurality of inflatable bags configured to reduce impact on the spacecraft frame during landing, each of the inflatable bags having a respective pressure sensor and a respective inflation valve, wherein each of the inflation valves is controllable electrically and has a behavior profile predictive of an amount of current used by the valve when operated; and a valve controller having a pressure management circuit configured to receive pressure information from the pressure sensors and to automatically maintain a respective selected pressure in each of the inflatable bags by issuing commands to operate the inflation valves; wherein the valve controller further includes an electrical current management circuit configured to: predict, based on the valve behavior profiles, what effect each of the commands issued by the pressure management circuit would have on a total current usage, if executed, and automatically prevent any command that would cause the total current usage to exceed a maximum allowable current.

In some embodiments, a method for controlling pressure without exceeding a maximum allowable electrical current may include: controlling a plurality of inflation valves coupled to a plurality of respective inflatable objects using a valve controller, wherein each of the inflatable objects has a respective pressure sensor and each of the inflation valves has a behavior profile predictive of an amount of current used by the valve when operated; receiving, at a pressure management circuit of the valve controller, pressure information from the pressure sensors; automatically maintaining a respective selected pressure in each of the inflatable objects by issuing commands, using the pressure management circuit, to operate the inflation valves; predicting, using the electrical current management circuit and based on the valve behavior profiles, what effect each of the commands issued by the pressure management circuit would have on a total current usage, if executed; and automatically preventing, using the electrical current management circuit, any command that would cause the total current usage to exceed a maximum allowable current.

Features, functions, and advantages may be achieved independently in various embodiments of the present disclosure, or may be combined in yet other embodiments, further details of which can be seen with reference to the following description and drawings.

DESCRIPTION

Figure 2:
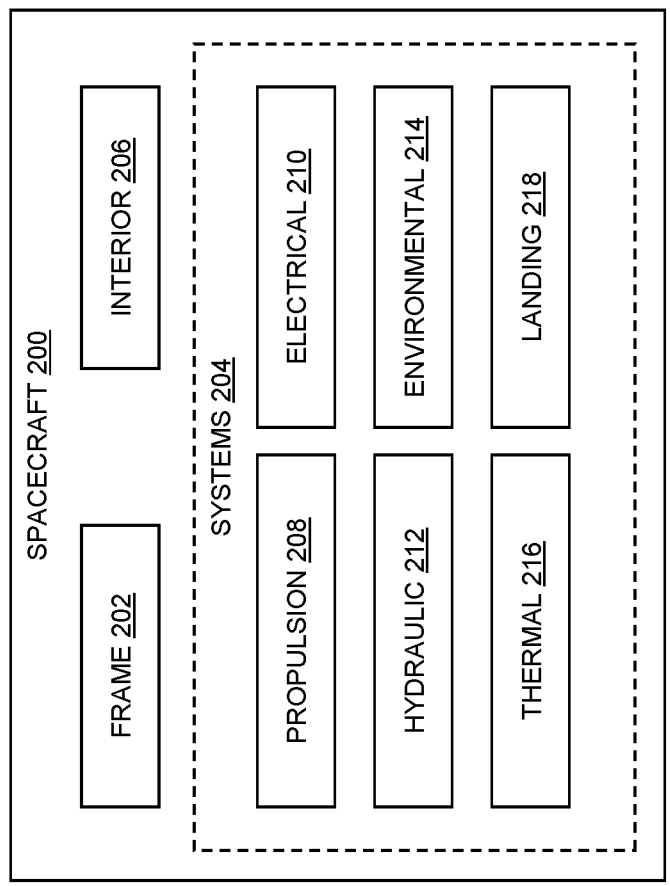
FIG. 2 is a schematic diagram of an illustrative spacecraft.

Various aspects and examples of a predictive valve control system, as well as related devices and methods, are described below and illustrated in the associated drawings. Unless otherwise specified, a predictive valve system according to the present teachings, and/or its various components may, but are not required to, contain at least one of the structure, components, functionality, and/or variations described, illustrated, and/or incorporated herein. Furthermore, unless specifically excluded, the process steps, structures, components, functionalities, and/or variations described, illustrated, and/or incorporated herein in connection with the present teachings may be included in other similar devices and methods, including being interchangeable between disclosed embodiments. The following description of various examples is merely illustrative in nature and is in no way intended to limit the disclosure, its application, or uses. Additionally, the advantages provided by the examples and embodiments described below are illustrative in nature and not all examples and embodiments provide the same advantages or the same degree of advantages.

Definitions

The following definitions apply herein, unless otherwise indicated.

"Substantially" means to be more-or-less conforming to the particular dimension, range, shape, concept, or other aspect modified by the term, such that a feature or component need not conform exactly. For example, a "substantially cylindrical" object means that the object resembles a cylinder, but may have one or more deviations from a true cylinder.

"Comprising," "including," and "having" (and conjugations thereof) are used interchangeably to mean including but not necessarily limited to, and are open-ended terms not intended to exclude additional, unrecited elements or method steps.

Terms such as "first", "second", and "third" are used to distinguish or identify various members of a group, or the like, and are not intended to show serial or numerical limitation.

"Coupled" means connected, either permanently or releasably, whether directly or indirectly through intervening components, and is not necessarily limited to physical connection(s).

Overview

A predictive control system as described herein may actively manage the states of a plurality of devices, such as valves, to ensure electrical current remains within limits. This management may be achieved without directly monitoring actual current usage. Systems and methods described herein may be implemented to manage a variety of devices, such as actuators, effectors, motors, and the like. Examples that follow will describe the disclosed systems and methods in the context of pneumatic valves controlled based on a desired pressure profile. One having skill in the art should recognize that substantially similar systems and methods may be used in other contexts, such as to hydraulically control steering of a missile based on flight feedback.

In general, a predictive valve control system may be configured to predict and manage valve power consumption in an environment lacking direct feedback regarding actual power consumption. Such environments are common in avionics and other scenarios where power requirements are stringent. Space missions, in particular, typically have a finite amount of power available for use by the on-board systems, and each subsystem needs to meet strict power budget requirements. An illustrative system or subsystem may include a controller running a program configured to receive sensor inputs (e.g., pressure readings) and activate devices (e.g., valves) to control the sensed characteristic (e.g., pressure) within a desired range or according to a desired profile. For example, valves may be controlled electrically to maintain air pressure (e.g., according to a desired inflation profile) in one or more inflatable bags or cushions of a landing system for a spacecraft. The valves may exhibit nonlinear, but predictable current consumption. For example, the "pull-in" phase of valve opening may have a higher current consumption than the "holding" phase, where the valve is maintained in an open state. In this example, the valves are biased to fail in a closed position, such that opening the valve and maintaining the valve in an open configuration require electrical power.

The predictive valve control system functions as a middle-man between (a) the master algorithm issuing high-level commands and (b) the drivers that respond by issuing valve actuator-level commands. By monitoring valve states, expected current consumption levels, and the resulting available current, the valve control system can determine whether to allow or deny a high-level command. Selective denial of commands is used to prevent the system from exceeding the maximum allowable current. Additional description of these controls may be found below.

Aspects of the predictive control systems described herein may be embodied as a computer method, computer system, or computer program product. Accordingly, these aspects may take the form of an entirely hardware embodiment, an entirely software embodiment (including firmware, resident software, micro-code, and the like), or an embodiment combining software and hardware aspects, all of which may generally be referred to herein as a "circuit," "module," or "system." Furthermore, aspects of the predictive control systems may take the form of a computer program product embodied in a computer-readable medium (or media) having computer-readable program code/instructions embodied thereon.

Any combination of computer-readable media may be utilized. Computer-readable media can be a computer-readable signal medium and/or a computer-readable storage medium. A computer-readable storage medium may include an electronic, magnetic, optical, electromagnetic, infrared, and/or semiconductor system, apparatus, or device, or any suitable combination of these. More specific examples of a computer-readable storage medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, and/or any suitable combination of these and/or the like. In the context of this disclosure, a computer-readable storage medium may include any suitable tangible medium that can contain or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electromagnetic, optical, and/or any suitable combination thereof. A computer-readable signal medium may include any computer-readable medium that is not a computer-readable storage medium and that is capable of communicating, propagating, or transporting a program for use by or in connection with an instruction execution system, apparatus, or device.

Program code embodied on a computer-readable medium may be transmitted using any appropriate medium, including but not limited to wireless, wireline, optical fiber cable, RF, and/or the like, and/or any suitable combination of these.

Computer program code for carrying out operations for aspects of the predictive control systems may be written in one or any combination of programming languages, including an object-oriented programming language, such as Java or C++, and conventional procedural programming languages, such as C. Mobile apps may be developed using any suitable language, including those previously mentioned, as well as Objective-C, Swift, C#, HTML5, and the like. The program code may execute entirely on a user's computer, partly on the user's computer, as a stand-alone software package, partly on the user's computer and partly on a remote computer, or entirely on the remote computer or server. In the latter scenario, the remote computer may be connected to the user's computer through any type of computer network, including a local area network (LAN) or a wide area network (WAN), and/or the connection may be made to an external computer (for example, through the Internet using an Internet Service Provider).

Aspects of the predictive control systems are described below with reference to flowchart illustrations and/or block diagrams of methods, apparatuses, systems, and/or computer program products. Each block and/or combination of blocks in a flowchart and/or block diagram may be implemented by computer program instructions. The computer program instructions may be provided to a processor of a general purpose computer, special purpose computer, or other programmable data processing apparatus to produce a machine, such that the instructions, which execute via the processor of the computer or other programmable data processing apparatus, create means for implementing the functions or steps specified in the flowchart and/or block diagram block(s). In some examples, machine-readable instructions may be programmed onto a programmable logic device, such as a field programmable gate array (FPGA).

These computer program instructions can also be stored in a computer-readable medium that can direct a computer, other programmable data processing apparatus, and/or other device to function in a particular manner, such that the instructions stored in the computer-readable medium produce an article of manufacture including instructions which implement the function/act specified in the flowchart and/or block diagram block(s).

The computer program instructions can also be loaded onto a computer, other programmable data processing apparatus, and/or other device to cause a series of operational steps to be performed on the device to produce a computer-implemented process such that the instructions which execute on the computer or other programmable apparatus provide processes for implementing the functions/acts specified in the flowchart and/or block diagram block(s).

Examples, Components, and Alternatives

The following sections describe selected aspects of exemplary predictive valve control systems, as well as related systems and/or methods. The examples in these sections are intended for illustration and should not be interpreted as limiting the entire scope of the present disclosure. Each section may include one or more distinct embodiments or examples, and/or contextual or related information, function, and/or structure.

A. Illustrative Spacecraft and Associated Method

Figure 1:
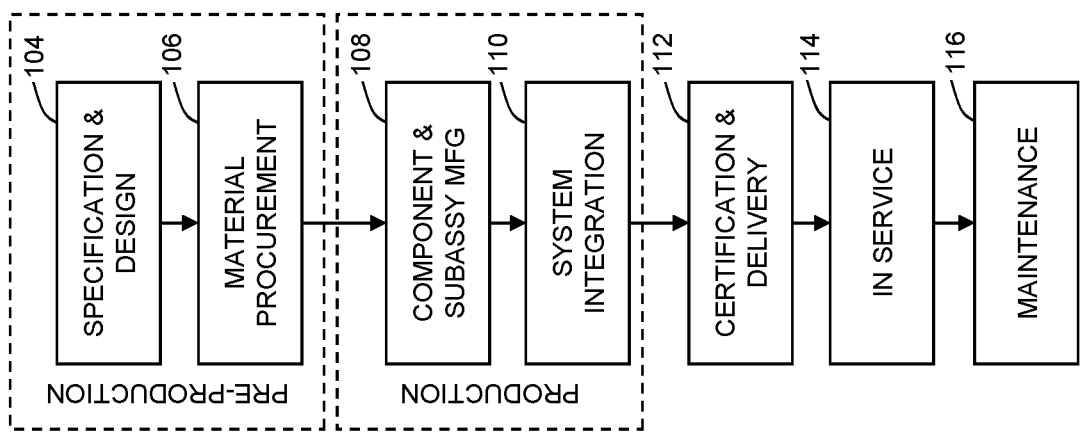
FIG. 1 is a flowchart depicting phases in an illustrative spacecraft lifecycle.

Examples disclosed herein may be described in the context of an illustrative spacecraft manufacturing and service method 100 (see FIG. 1) and an illustrative spacecraft 200 (see FIG. 2). Method 100 includes a plurality of processes, stages, or phases. During pre-production, method 100 may include a specification and design phase 104 of spacecraft 200 and a material procurement phase 106. During production, a component and subassembly manufacturing phase 108 and a system integration phase 110 of spacecraft 200 may take place. Thereafter, spacecraft 200 may go through a certification and delivery phase 112 to be placed into in-service phase 114. While in service (e.g., by an operator), spacecraft 200 may be scheduled for routine maintenance and service 116 (which may also include modification, reconfiguration, refurbishment, and so on of one or more systems of spacecraft 200). While the embodiments described herein relate generally to operational use during in-service phase 114 of spacecraft 200, they may be practiced at other stages of method 100.

Each of the processes of method 100 may be performed or carried out by a system integrator, a third party, and/or an operator (e.g., a customer). For the purposes of this description, a system integrator may include, without limitation, any number of spacecraft manufacturers and major-system subcontractors; a third party may include, without limitation, any number of vendors, subcontractors, and suppliers; and an operator may be an airline, leasing company, military entity, service organization, and so on.

As shown in FIG. 2, spacecraft 200 produced by illustrative method 100 may include a frame 202 with a plurality of systems 204 and an interior 206. Examples of plurality of systems 204 include one or more of a propulsion system 208, an electrical system 210, a hydraulic system 212, an environmental system 214, a thermal system 216, and a landing system 218. Each system may comprise various subsystems, such as controllers, processors, actuators, effectors, motors, generators, etc., depending on the functionality involved. Any number of other systems may be included. Although an aerospace example is shown, the principles disclosed herein may be applied to other industries, such as the automotive industry, aircraft industry, and nautical engineering industry. Accordingly, in addition to spacecraft 200, the principles disclosed herein may apply to other vehicles, e.g., land vehicles, marine vehicles, aircraft, etc.

Apparatuses and methods shown or described herein may be employed during any one or more of the stages of the manufacturing and service method 100. For example, components or subassemblies corresponding to component and subassembly manufacturing phase 108 may be fabricated or manufactured in a manner similar to components or subassemblies produced while spacecraft 200 is operating during in-service phase 114. Also, one or more examples of the apparatuses, methods, or combinations thereof may be utilized during production stages 108 and 110, for example, by substantially expediting assembly of or reducing the cost of spacecraft 200. Similarly, one or more examples of the apparatus or method realizations, or a combination thereof, may be utilized, for example and without limitation, while spacecraft 200 is in service phase 114 and/or during maintenance and service phase 116.

B. Illustrative Control Subsystems

Figure 3:
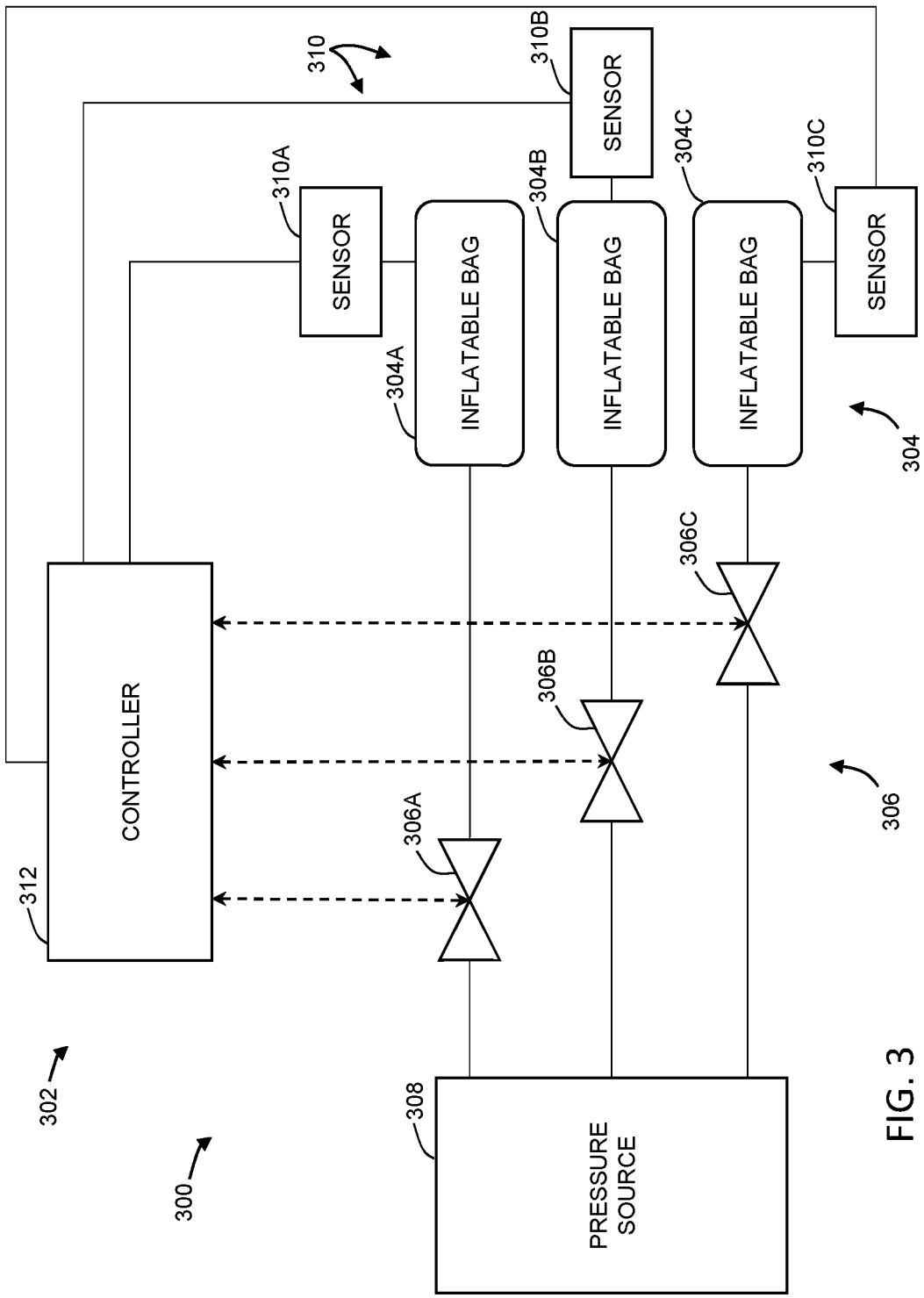
FIG. 3 is a schematic diagram of an illustrative subsystem of the aircraft of FIG. 2.
Figure 4:
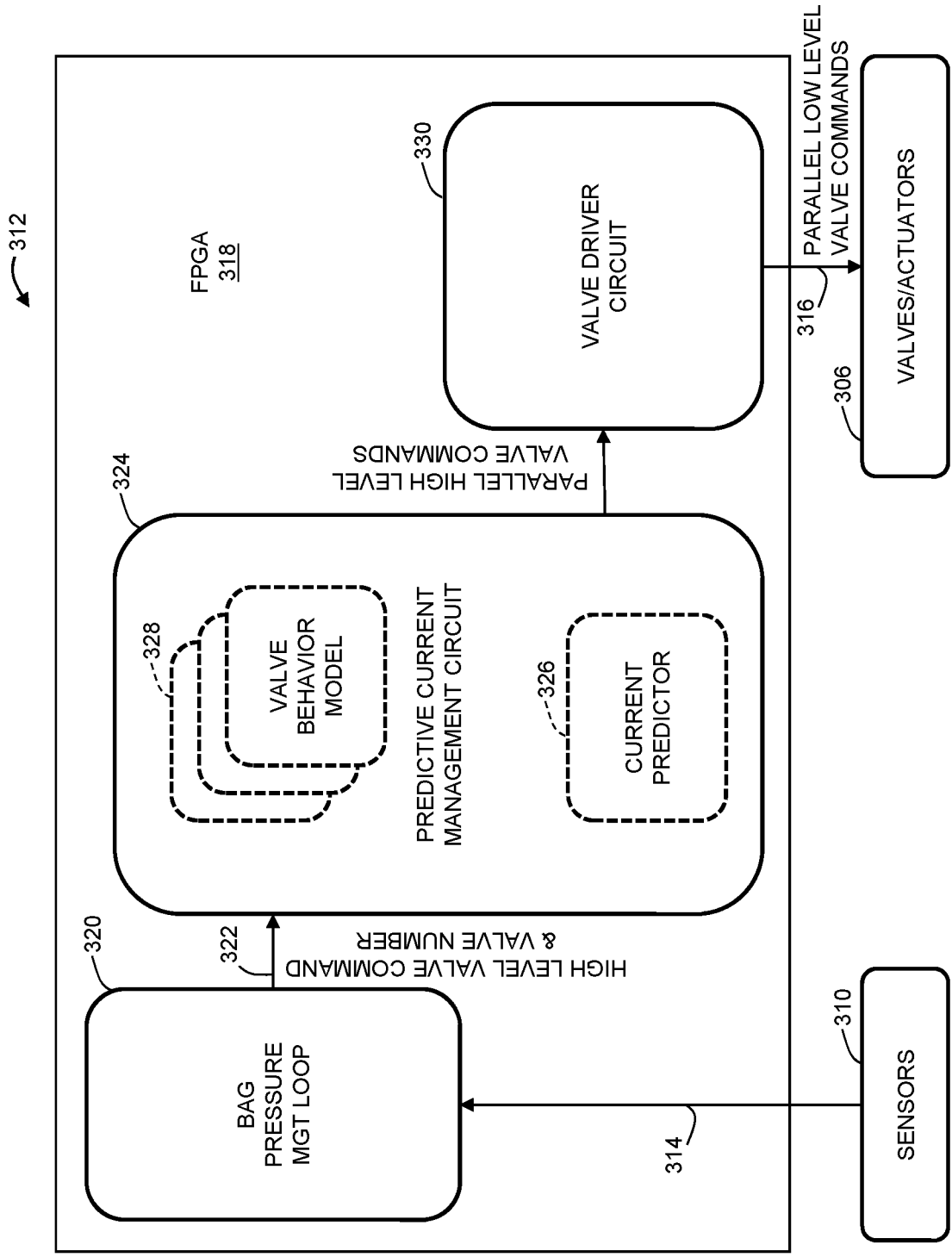
FIG. 4 is a schematic diagram of an illustrative control circuit of the subsystem of FIG. 3.

As shown in FIGS. 3 and 4, this section describes aspects of an air pressure control system 300 having a predictive valve control system 302 according to the present teachings. Predictive valve control system 302 is an example of the control system described in the overview above. System 300 may comprise a subsystem of spacecraft 200. In the following examples, system 300 is part of an inflatable bag subsystem of landing system 218. However, one having skill in the art will understand that similar control circuits and devices may be used in other contexts and in other subsystems.

FIG. 3 is a schematic diagram of an illustrative pressure control system, and FIG. 4 is a schematic diagram of the controller portion of the system of FIG. 3.

As shown in FIG. 3, in the present example, the landing system of spacecraft 200 includes a plurality of inflatable objects, namely inflatable bags 304. FIG. 3 depicts three such bags, but more or fewer may be utilized. Furthermore, in some examples, some inflatable bags may be physically disposed inside other inflatable bags. Inflatable bags 304 may, for example, facilitate a cushioned landing for spacecraft 200, e.g., by absorbing impact forces. Inflatable bags 304 may be referred to interchangeably as cushions, pillows, and/or bladders. For convenience of description, inflatable bags 304 are labeled in FIG. 3 as bag 304A, bag 304B, and bag 304C.

Pressure control system 300 may include any suitable devices and controls configured to control pressure inside inflatable bags 304 in accordance with a predetermined pressure profile. This predetermined pressure profile may include any suitable profile elements, such as a constant desired pressure, a tolerance level, a desired pressure curve that varies over time, an event-based pressure target, and/or the like. In some examples, the predetermined pressure profile may be different for some or each of the inflatable bags. In some examples, the predetermined pressure profile may have an initial time-dependent curve triggered by initial inflation, followed by a constant target as the bag is maintained at a desired pressure. The target pressure may be dependent on environmental conditions, such as altitude, mass of the spacecraft, and/or the like.

In this example, pressure control system 300 includes respective pressure control valves 306 for each of the inflatable bags, correspondingly labeled as 306A, 306B, and 306C. Each pressure control valve 306 (also referred to as an inflation valve and/or inlet valve) may include any suitable number and type of electrically-operated pneumatic valves, such as a solenoid air control valve. For purposes of this description, the pressure control valves 306 are electrically controllable, configured to fail in a closed position, and exhibit predictable electrical characteristics when opening and when maintaining an open position. Specifically, this means that each valve pulls a known, relatively high electrical current during an opening phase, a known, relatively lower current during a "hold" phase (i.e., where the valve is held open), and effectively no current when the valve is shut. Throughout this description, these currents may be referred to as $i_{opening}$, $i_{holding}$, and $i_{shut}$ respectively. In some examples, the opening and holding phases are (or can be considered) effectively discrete, each corresponding to a respective number of amps. In some examples, the opening phase in particular may be modeled by a formula reflecting the time-variant nature of the inrush current, i.e., where the number of amps varies as a function of time. In all of these examples, predictive valve control system 302 is configured to use whichever current-usage model is selected to predict and determine the current(s) associated with each of valves 306A, 306B, and 306C, depending, for example, on the valve's state and time since the last command to open (or shut).

A pressure source 308 (e.g., of compressed air) supplies inflation air to each of the inflatable bags via valves 306. In some examples, all of the air bags share a common pressure source. In some examples, the inflatable bags have individual pressure sources. In some examples, the inflatable bags are grouped, with each group sharing a common pressure source. Pressure source 308 may include any suitable source of compressed air, and may comprise a plurality of vessels or tanks, e.g., arranged to provide redundancy.

A plurality of pressure sensors 310 are included to determine the air pressure in each of the inflatable bags at any given time, and to provide an output signal that can be used by pressure control system 300. Accordingly, each of the inflatable bags has an associated pressure sensor, 310A, 310B, 310C. Sensors 310 may include any suitable transducer configured to determine pressure level inside the respective air bag. The sensors may, for example, be integrated with the bags, or may be mounted on an inlet tube or pipe. One or more sensors may be utilized for each air bag, to improve redundancy, accuracy, and/or provide sensed pressure in different portions of the bag.

Outputs from sensors 310 are communicated to a controller 312, as indicated in FIG. 3. This may be carried out, for example, by a wired and/or wireless communication link. Controller 312 may include any suitable data processing system (see FIG. 8 and accompanying description) configured to determine the desired inflation status and pressures of the various inflatable bags, e.g., in response to an event and/or per a predetermined deployment and/or maintenance sequence, and to communicate commands to actuate valves 306 in accordance with the desired outcome. Furthermore, as described further below, controller 312 may include a watchdog portion or subsystem configured to ensure that a predetermined maximum electrical power usage (e.g., a power budget) for the valves is not exceeded, without direct feedback as to actual power usage.

For example, controller 312 may determine that all of the inflatable bags are to be inflated, which results in high-level commands being issued by the controller to open each of the valves, allowing air from pressure source 308 to flow into the bags. However, it may be the case that simultaneous opening of all three valves would result in simultaneous $i_{opening}$ values that, in combination, exceed the maximum allowable current (referred to as $i_{max}$). Controller 312 predicts that failure, based on expected electrical current values, and prevents one or more of the commands from reaching the valve's lower-level actuator drivers until sufficient current is again available (e.g., when one or more valves are in holding or shut mode).

Turning to FIG. 4, an illustrative embodiment of controller 312 and other elements of system 300 are depicted schematically. In this example, controller 312 receives input 314 from sensors 310 and provides output 316 in the form of low level valve actuation commands to actuators (or effectors) of valves 306. Also in this example, controller 312 may be implemented as machine-readable instructions programmed on a field programmable gate array (FPGA) circuit 318, or as one or more state machines and associated logic in FPGA circuit 318, e.g., as a dedicated-purpose hardware circuit.

A first circuit or module, namely a bag pressure management circuit 320, is configured to monitor the inflatable bag pressure information provided by sensors 310, and to issue high level commands 322 to initiate bag inflation, maintain bag pressure in accordance with a desired pressure profile or target pressure (e.g., within a selected range). Bag pressure management circuit 320 may be implemented as a looping algorithm. For example, circuit 320 may loop through each of the valves in turn, checking the status of each bag 304 by checking the pressure indication from the corresponding sensor 310, determining whether the corresponding valve 306 needs to be opened or closed based on how the measured pressure corresponds to the desired pressure, and issuing command 322 (e.g., an output signal) to open or close that valve.

A second circuit or module, namely a predictive current management circuit 324, is configured to receive each high-level commands 322, predict whether the command will cause system 300 to exceed its maximum allowable electrical current, and prevent or allow the command based on that prediction. To carry out this task, circuit 324 includes a current predictor module 326 and valve behavior models 328, which in combination may be referred to as a current watchdog circuit.

Predictive current management circuit 324 predicts the effect of a valve command in part by keeping track of the present state and expected current draw of each valve 306. The expected current draw of any given valve is determined by that valve's behavior model 328. For example, a behavior model may show that the valve is expected to have an $i_{opening}$ of 5 amps during an initial opening phase lasting 100 ms, and an $i_{holding}$ of 2.2 amps while the valve is open thereafter. Other valves may have identical characteristics, or may respond in accordance with a nonlinear behavior that ramps up quickly, then levels off at a lower steady-state value. In either case, these behavior models are incorporated into controller 312 and utilized by predictive current management circuit 324 to determine the moment-to-moment current draw for each valve 306. The current predictor circuit keeps track of where each valve is, timewise, within its particular behavior model 328, and sums the resulting current values to determine the total current usage.

Predictive current management circuit 324 further predicts what the total current usage would be if the present high-level command 322 were to be allowed to execute. Current predictor circuit 326 uses the corresponding valve behavior model to determine how much additional current would be used if the command were to be allowed, adding that amount to the total current usage. If the resulting value exceeds the budget, the present command is rejected. If not, the command is allowed. No indication or measurement of actual current flow or energy usage is required, reducing the amount of necessary equipment. Further description of illustrative algorithms is provided below.

When the high-level valve command is allowed, it is passed to a valve actuator driver circuit 330, which includes appropriate device drivers for each of the valve actuators or actuation devices. Driver circuit 330 may include any suitable module configured to translate high-level commands 322 into the appropriate low-level hardware commands 316 to operate (i.e., open/close) valves 306.

Due to relative operating speeds, predictive current management circuit 324 may operate significantly (e.g., an order of magnitude) faster than bag pressure management circuit 320. Accordingly, for example, high level valve commands may be assessed and allowed or rejected before the pressure management loop returns to reassess the same valve.

C. Illustrative Control Methods and Algorithms

Figure 5:
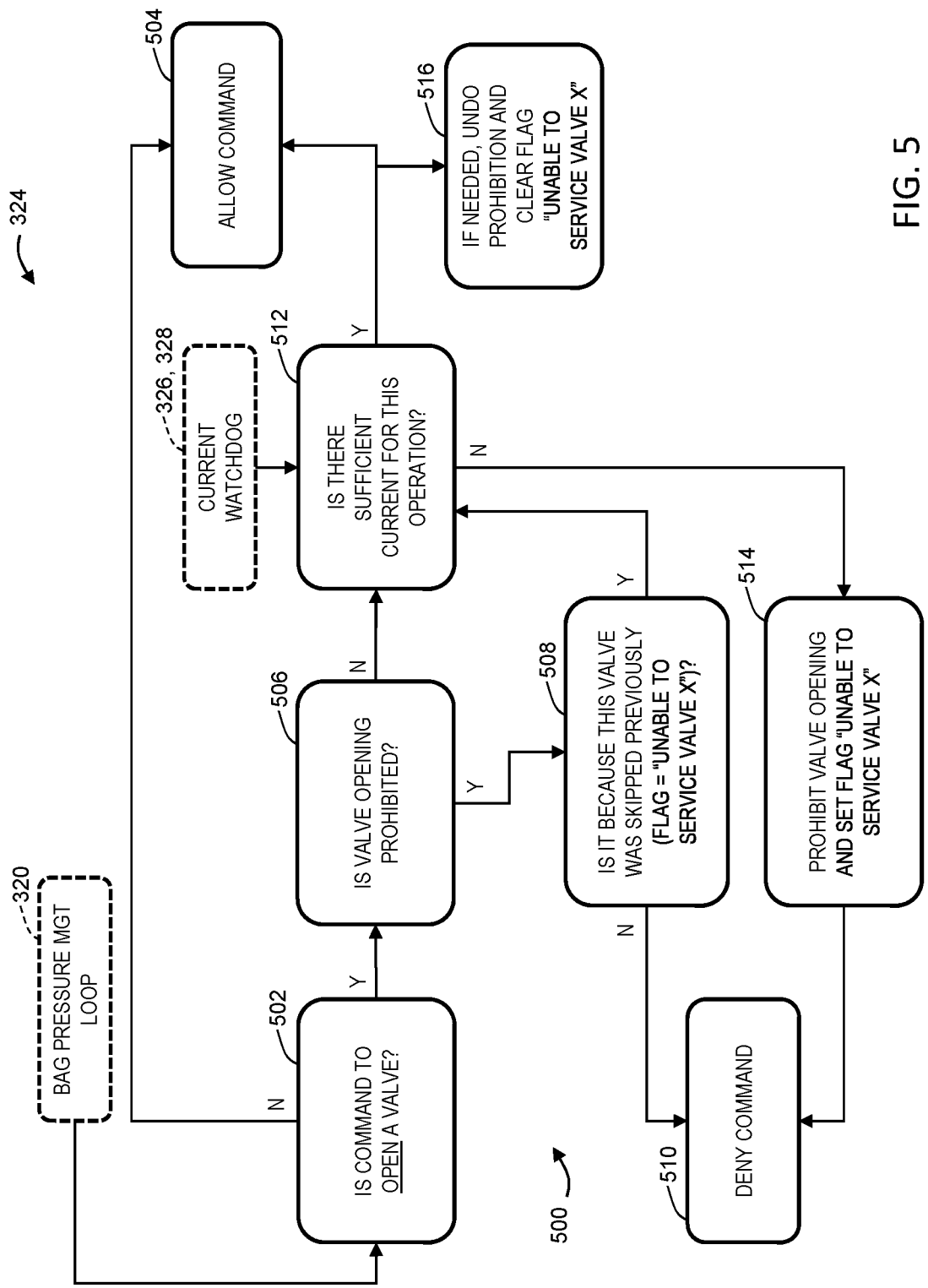
FIG. 5 is a flowchart depicting steps in a first illustrative algorithm suitable for use in the control circuit of FIG. 4.
Figure 6:
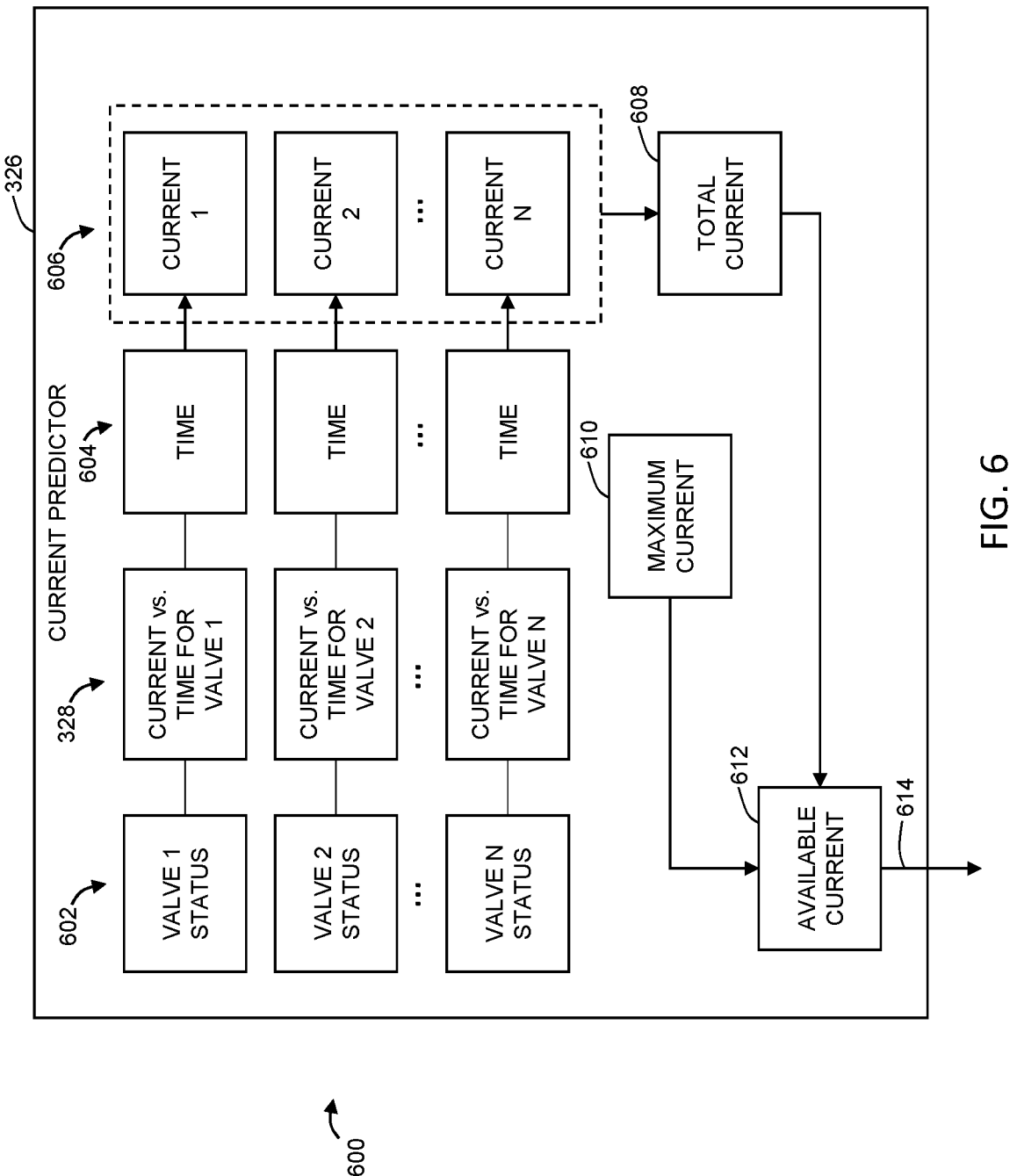
FIG. 6 is a schematic diagram of an illustrative method for predicting electrical current usage in a system.
Figure 7:
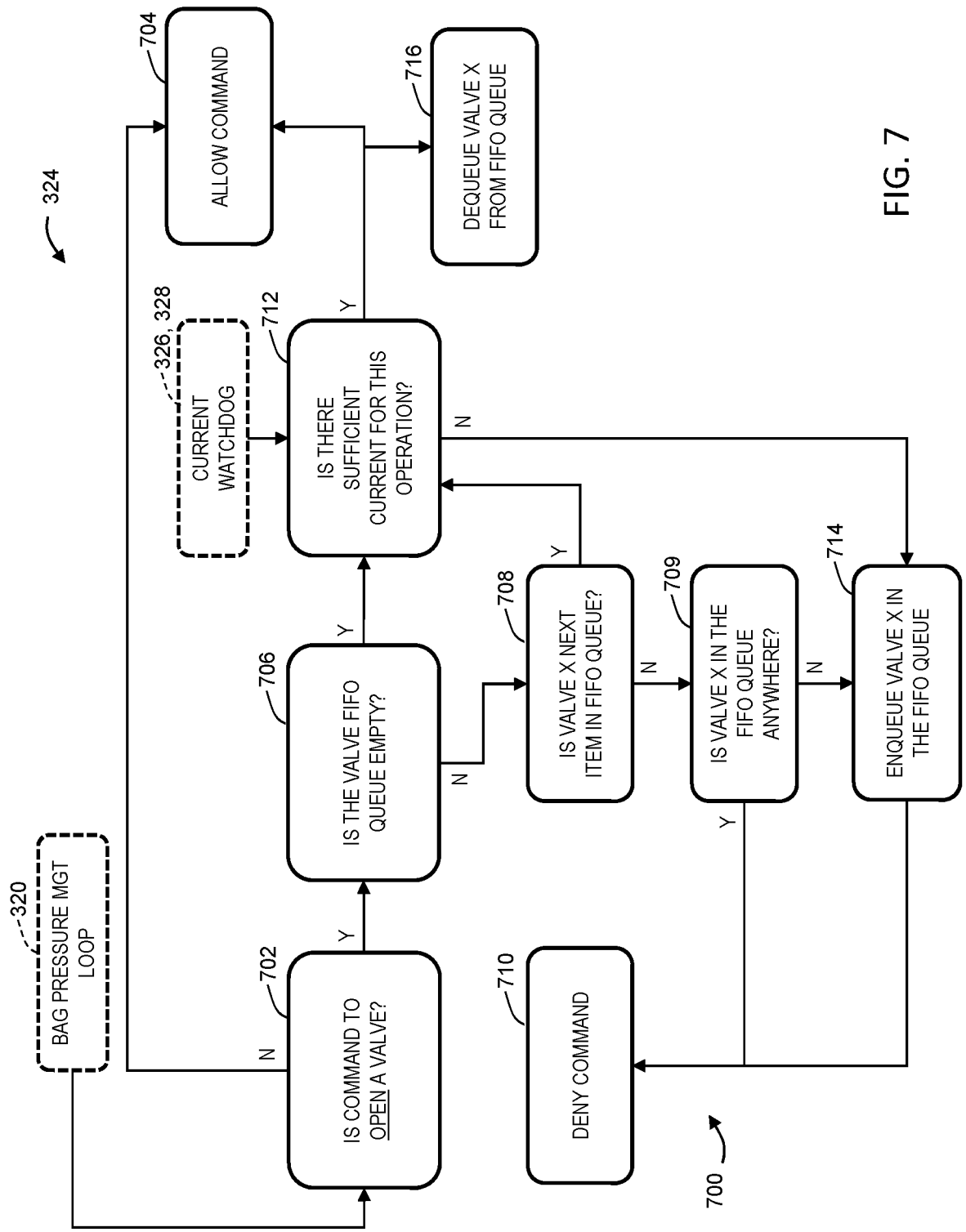
FIG. 7 is a flowchart depicting steps in a second illustrative algorithm suitable for use in the control circuit of FIG. 4.

This section describes steps of illustrative methods or algorithms for carrying out aspects of the functionality of predictive current management circuit 324; see FIGS. 5-7. Aspects of the control circuits and systems described above may be utilized in the method steps described below. Where appropriate, reference may be made to components and systems that may be used in carrying out each step. These references are for illustration, and are not intended to limit the possible ways of carrying out any particular step of the method in question.

FIG. 5 is a flowchart illustrating steps performed in an illustrative algorithm 500, and may not recite the complete process or all steps of the algorithm. Although various steps of method 500 are described below and depicted in FIG. 5, the steps need not necessarily all be performed, and in some cases may be performed simultaneously or in a different order than the order shown.

At step 502 of method 500, circuit 324 receives a high-level command from bag pressure management loop 320, including a command (e.g., open or close) and valve identifier (e.g., a valve number, name, etc.), and determines whether the command is specifically intended to open a valve. Opening a valve would include additional current usage by the system, and therefore must be assessed before being allowed. If circuit 324 determines that the command is not an open command, the algorithm jumps to step 504, in which the command is allowed to pass to the device driver circuit. This occurs because a non-opening command (e.g., a command to shut) will not increase the current usage. In fact, because valves 306 fail shut, a command to shut a valve will result in a reduction in current usage. Accordingly, there is no danger of exceeding the maximum current, and no need to perform further analysis.

If it is instead determined at step 502 that an open command has been issued, control passes to step 506, in which circuit 324 determines whether valve opening is presently prohibited. Prohibition may be determined by any suitable method, such as by checking the status or value of a variable intended for this purpose. In some examples, a Boolean variable is used (e.g., prohibited yes or prohibited no), and/or a non-Boolean variable that stores the identifier (ID) of the valve that caused the prohibition (see step 514). In some examples, only the valve identifier is stored, with a valid valve ID meaning prohibition is in place, and a null value or unique identifier indicating that there is no prohibition.

If it is determined in step 506 that valve opening is prohibited, step 508 includes determining whether the valve that is being ordered to open matches the valve that caused the prohibition on opening. If not, step 510 includes denying the open command. This is the case because the system would prefer to open a valve that has already been denied. If, instead, it is determined in step 508 that the command is to open the valve that caused the prohibition, control passes to step 512. Moreover, if step 506 finds that valve opening is allowed (i.e., not prohibited), then control again passes to step 512.

Step 512 of algorithm 500 includes determining whether there is sufficient electrical current available for the command to be executed. The current watchdog circuit (see above and FIG. 6) determines the present total current being used and predicts what the total current would be if the command is executed to open this particular valve. If there is sufficient current available, the command is allowed at step 504. If not, step 514 includes prohibiting (or continuing to prohibit) further valve opening and recording which valve caused this prohibition, as well as again denying the present high-level open command.

In addition, if there was sufficient current to allow the command at step 512, a further step, step 516, includes clearing or undoing the prohibition (e.g., by changing the value of the associated variable(s)) if needed (i.e., if prohibition had previously been in effect).

Turning to FIG. 6, an illustrative algorithm or method 600 for predicting total current usage is depicted, suitable for use in current predictor circuit 326. As described above, current predictor circuit 326 may keep track of a status 602 for each valve (e.g., on or off, open or shut), and use the valve behavior models 328 for each valve to determine the current 606 associated with the valve. This current for each valve may be predicted by the present amount of time 604 that the valve has been in the present status (e.g., how long since the open command was issued). By performing this prediction or determination for each valve, a total current 608 may be calculated as the sum of the various valve currents 606. This total current 608 is then compared to $i_{max}$ 610 to determine available current 612. An output 614 of the current predictor circuit may be a yes or no, regarding whether sufficient current is available to allow the present command to be executed. This type of output may be determined by virtually changing the status of the valve in question to reflect execution of the present order (i.e., to open the valve), and then determining if total current 608 exceeds maximum allowable current 610. In some examples, the amount of available current is instead calculated without changing the status of the valve in question, and then the available current is compared to the initial (or the maximum) current used by the valve in question to determine sufficiency.

Turning now to FIG. 7, a flowchart is depicted, illustrating steps performed in an illustrative algorithm 700, and may not recite the complete process or all steps of the algorithm. Although various steps of method 700 are described below and depicted in FIG. 7, the steps need not necessarily all be performed, and in some cases may be performed simultaneously or in a different order than the order shown.

Algorithm 700 is similar to algorithm 500, and has the same general purpose, which is to determine whether or not to allow a high-level valve command from bag pressure management loop 320. However, algorithm 700 may be suitable for examples where it is desired to keep track of the denial of multiple valve commands. Accordingly, rather than a variable that stores the valve ID that was denied, thereby temporarily prohibiting further valve opening until sufficient current becomes available, algorithm 700 keeps track of multiple denied IDs using a list or queue data structure, specifically a first-in-first-out (FIFO) queue. In this way, it may be ensured that valves are operated in the original order intended.

Step 702 of algorithm 700 is substantially identical to step 502, and circuit 324 receives a high-level command from bag pressure management loop 320, including a command (e.g., open or close) and valve identifier (e.g., a valve number, name, etc.), and determines whether the command is specifically intended to open a valve. As in method 500, if circuit 324 determines that the command is not an open command, the algorithm jumps to step 704, in which the command is allowed to pass to the device driver circuit.

If it is instead determined at step 702 that an open command has been issued, control passes to step 706, in which circuit 324 determines whether valve opening is presently prohibited. Prohibition in this example may be determined by checking whether a FIFO queue configured to contain valve IDs is empty. Because the queue includes only the IDs of valves that have been skipped or denied, an empty queue will indicate that there is presently no prohibition on opening.

If it is determined in step 706 that valve opening is prohibited, step 708 includes determining whether the valve that is being ordered to open matches the valve ID that is next in the FIFO queue (i.e., the valve ID that has been in the queue the longest). If not, then step 709 includes determining whether the ID of the valve in question is in the queue at all (i.e., not just next). If that is the case, then there is no need to add it to the list, and the command to open that valve is simply denied at step 710. If the valve ID is not in the queue, then it is first added at step 714 and then the command is denied.

If step 708 instead results in a determination that the valve in question is indeed the next item in the FIFO queue, that means the command is to open the first valve that caused the present prohibition, and control passes to step 712. Moreover, if step 706 finds the queue empty, no prohibition is in effect, and control again passes to step 712.

Step 712 of algorithm 700 is substantially identical to step 512 of algorithm 500, and therefore includes determining whether there is sufficient electrical current available for the command to be executed. If there is sufficient current available, the command is allowed at step 704. If not, step 714 includes adding the valve ID to the queue (i.e., enqueueing the valve ID), and denting the present high-level open command at step 710.

In addition, if there was sufficient current to allow the command at step 712, a further step, step 716, includes removing or dequeuing the valve ID from the FIFO queue. This will have the effect of clearing or undoing the prohibition if prohibition had previously been in effect and no additional valve IDs are in the queue. If further IDs are present in the queue, then the prohibition will remain in effect for all valves except the one that is next in the queue.

D. Illustrative Data Processing System

Figure 8:
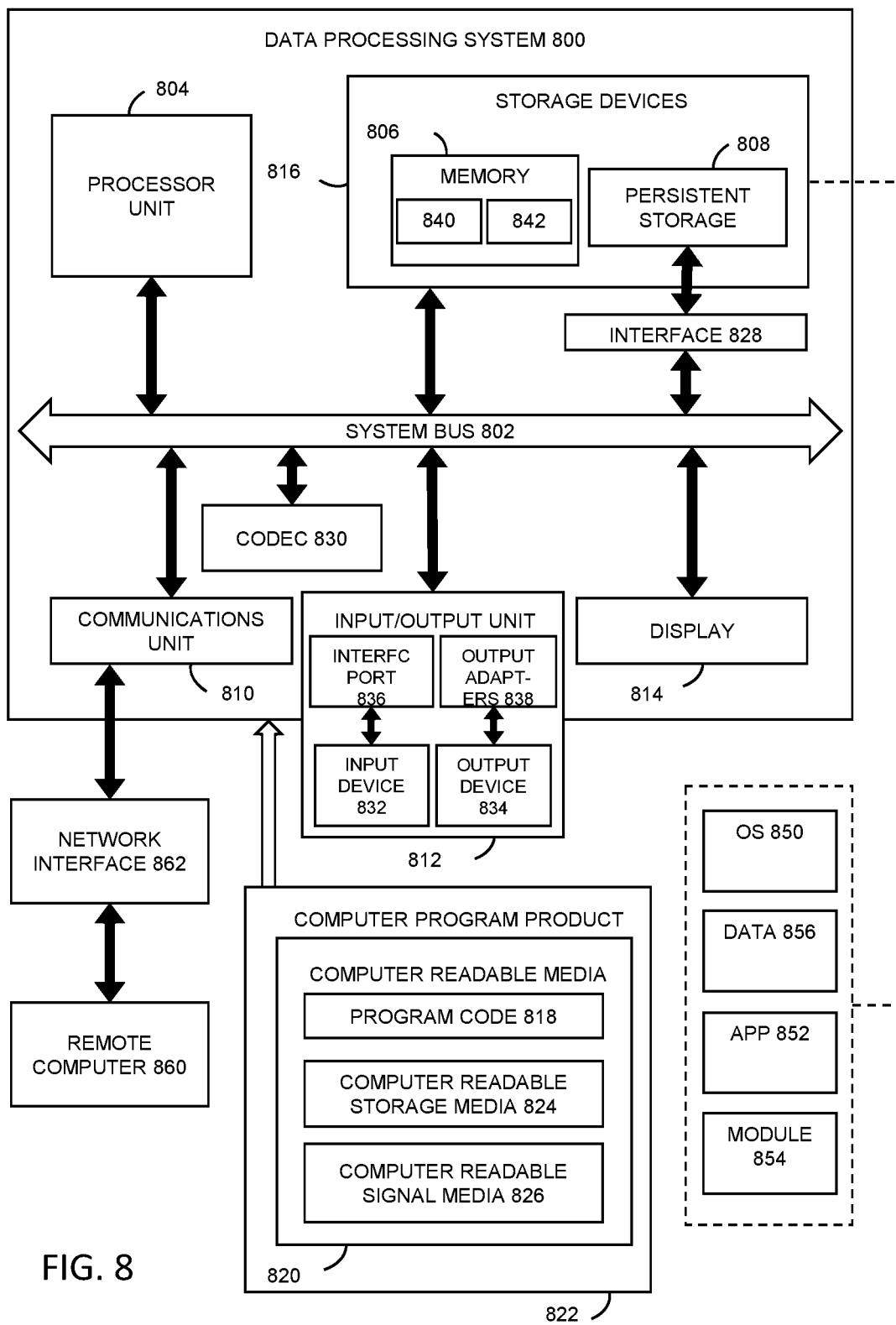
FIG. 8 is a schematic diagram of an illustrative data processing system suitable for implementing aspects of the present disclosure.

As shown in FIG. 8, this example describes a data processing system 800 (also referred to as a computer, computing system, and/or computer system) in accordance with aspects of the present disclosure. In this example, data processing system 800 is an illustrative data processing system suitable for implementing aspects of the control systems described above. More specifically, in some examples, devices that are embodiments of data processing systems (e.g., computers, ASICs, FPGAs, etc.) may be used to implement algorithms 500, 600, 700, circuits 320, 324, 326, 328, 330, and, in general, hardware such as controller 312.

In this illustrative example, data processing system 800 includes a system bus 802 (also referred to as communications framework). System bus 802 may provide communications between a processor unit 804 (also referred to as a processor or processors), a memory 806, a persistent storage 808, a communications unit 810, an input/output (I/O) unit 812, a codec 830, and/or a display 814. Memory 806, persistent storage 808, communications unit 810, input/output (I/O) unit 812, display 814, and codec 830 are examples of resources that may be accessible by processor unit 804 via system bus 802.

Processor unit 804 serves to run instructions that may be loaded into memory 806. Processor unit 804 may comprise a number of processors, a multi-processor core, and/or a particular type of processor or processors (e.g., a central processing unit (CPU), graphics processing unit (GPU), etc.), depending on the particular implementation. Further, processor unit 804 may be implemented using a number of heterogeneous processor systems in which a main processor is present with secondary processors on a single chip. As another illustrative example, processor unit 804 may be a symmetric multi-processor system containing multiple processors of the same type.

Memory 806 and persistent storage 808 are examples of storage devices 816. A storage device may include any suitable hardware capable of storing information (e.g., digital information), such as data, program code in functional form, and/or other suitable information, either on a temporary basis or a permanent basis.

Storage devices 816 also may be referred to as computer-readable storage devices or computer-readable media. Memory 806 may include a volatile storage memory 840 and a non-volatile memory 842. In some examples, a basic input/output system (BIOS), containing the basic routines to transfer information between elements within the data processing system 800, such as during start-up, may be stored in non-volatile memory 842. Persistent storage 808 may take various forms, depending on the particular implementation.

Persistent storage 808 may contain one or more components or devices. For example, persistent storage 808 may include one or more devices such as a magnetic disk drive (also referred to as a hard disk drive or HDD), solid state disk (SSD), floppy disk drive, tape drive, Jaz drive, Zip drive, LS-80 drive, flash memory card, memory stick, and/or the like, or any combination of these. One or more of these devices may be removable and/or portable, e.g., a removable hard drive. Persistent storage 808 may include one or more storage media separately or in combination with other storage media, including an optical disk drive such as a compact disk ROM device (CD-ROM), CD recordable drive (CD-R Drive), CD rewritable drive (CD-RW Drive), and/or a digital versatile disk ROM drive (DVD-ROM). To facilitate connection of the persistent storage devices 808 to system bus 802, a removable or non-removable interface is typically used, such as interface 828.

Input/output (I/O) unit 812 allows for input and output of data with other devices that may be connected to data processing system 800 (i.e., input devices and output devices). For example, input device 832 may include one or more pointing and/or information-input devices such as a keyboard, a mouse, a trackball, stylus, touch pad or touch screen, microphone, joystick, game pad, satellite dish, scanner, TV tuner card, digital camera, digital video camera, web camera, and/or the like. These and other input devices may connect to processor unit 804 through system bus 802 via interface port(s) 836. Interface port(s) 836 may include, for example, a serial port, a parallel port, a game port, and/or a universal serial bus (USB).

Output devices 834 may use some of the same types of ports, and in some cases the same actual ports, as input device(s) 832. For example, a USB port may be used to provide input to data processing system 800 and to output information from data processing system 800 to an output device 834. Output adapter 838 is provided to illustrate that there are some output devices 834 (e.g., monitors, speakers, and printers, among others) which require special adapters. Output adapters 838 may include, e.g. video and sounds cards that provide a means of connection between the output device 834 and system bus 802. Other devices and/or systems of devices may provide both input and output capabilities, such as remote computer(s) 860. Display 814 may include any suitable human-machine interface or other mechanism configured to display information to a user, e.g., a CRT, LED, or LCD monitor or screen, etc.

Communications unit 810 refers to any suitable hardware and/or software employed to provide for communications with other data processing systems or devices. While communication unit 810 is shown inside data processing system 800, it may in some examples be at least partially external to data processing system 800. Communications unit 810 may include internal and external technologies, e.g., modems (including regular telephone grade modems, cable modems, and DSL modems), ISDN adapters, and/or wired and wireless Ethernet cards, hubs, routers, etc. Data processing system 800 may operate in a networked environment, using logical connections to one or more remote computers 860. A remote computer(s) 860 may include a personal computer (PC), a server, a router, a network PC, a workstation, a microprocessor-based appliance, a peer device, a smart phone, a tablet, another network note, and/or the like. Remote computer(s) 860 typically include many of the elements described relative to data processing system 800. Remote computer(s) 860 may be logically connected to data processing system 800 through a network interface 862 which is connected to data processing system 800 via communications unit 810. Network interface 862 encompasses wired and/or wireless communication networks, such as local-area networks (LAN), wide-area networks (WAN), and cellular networks. LAN technologies may include Fiber Distributed Data Interface (FDDI), Copper Distributed Data Interface (CDDI), Ethernet, Token Ring, and/or the like. WAN technologies include point-to-point links, circuit switching networks (e.g., Integrated Services Digital networks (ISDN) and variations thereon), packet switching networks, and Digital Subscriber Lines (DSL).

Codec 830 may include an encoder, a decoder, or both, comprising hardware, software, or a combination of hardware and software. Codec 830 may include any suitable device and/or software configured to encode, compress, and/or encrypt a data stream or signal for transmission and storage, and to decode the data stream or signal by decoding, decompressing, and/or decrypting the data stream or signal (e.g., for playback or editing of a video). Although codec 830 is depicted as a separate component, codec 830 may be contained or implemented in memory, e.g., non-volatile memory 842.

Non-volatile memory 842 may include read only memory (ROM), programmable ROM (PROM), electrically programmable ROM (EPROM), electrically erasable programmable ROM (EEPROM), flash memory, and/or the like, or any combination of these. Volatile memory 840 may include random access memory (RAM), which may act as external cache memory. RAM may comprise static RAM (SRAM), dynamic RAM (DRAM), synchronous DRAM (SDRAM), double data rate SDRAM (DDR SDRAM), enhanced SDRAM (ESDRAM), and/or the like, or any combination of these.

Instructions for the operating system, applications, and/or programs may be located in storage devices 816, which are in communication with processor unit 804 through system bus 802. In these illustrative examples, the instructions are in a functional form in persistent storage 808. These instructions may be loaded into memory 806 for execution by processor unit 804. Processes of one or more embodiments of the present disclosure may be performed by processor unit 804 using computer-implemented instructions, which may be located in a memory, such as memory 806.

These instructions are referred to as program instructions, program code, computer usable program code, or computer-readable program code executed by a processor in processor unit 804. The program code in the different embodiments may be embodied on different physical or computer-readable storage media, such as memory 806 or persistent storage 808. Program code 818 may be located in a functional form on computer-readable media 820 that is selectively removable and may be loaded onto or transferred to data processing system 800 for execution by processor unit 804. Program code 818 and computer-readable media 820 form computer program product 822 in these examples. In one example, computer-readable media 820 may comprise computer-readable storage media 824 or computer-readable signal media 826.

Computer-readable storage media 824 may include, for example, an optical or magnetic disk that is inserted or placed into a drive or other device that is part of persistent storage 808 for transfer onto a storage device, such as a hard drive, that is part of persistent storage 808. Computer-readable storage media 824 also may take the form of a persistent storage, such as a hard drive, a thumb drive, or a flash memory, that is connected to data processing system 800. In some instances, computer-readable storage media 824 may not be removable from data processing system 800.

In these examples, computer-readable storage media 824 is a physical or tangible storage device used to store program code 818 rather than a medium that propagates or transmits program code 818. Computer-readable storage media 824 is also referred to as a computer-readable tangible storage device or a computer-readable physical storage device. In other words, computer-readable storage media 824 is media that can be touched by a person.

Alternatively, program code 818 may be transferred to data processing system 800, e.g., remotely over a network, using computer-readable signal media 826. Computer-readable signal media 826 may be, for example, a propagated data signal containing program code 818. For example, computer-readable signal media 826 may be an electromagnetic signal, an optical signal, and/or any other suitable type of signal. These signals may be transmitted over communications links, such as wireless communications links, optical fiber cable, coaxial cable, a wire, and/or any other suitable type of communications link. In other words, the communications link and/or the connection may be physical or wireless in the illustrative examples.

In some illustrative embodiments, program code 818 may be downloaded over a network to persistent storage 808 from another device or data processing system through computer-readable signal media 826 for use within data processing system 800. For instance, program code stored in a computer-readable storage medium in a server data processing system may be downloaded over a network from the server to data processing system 800. The computer providing program code 818 may be a server computer, a client computer, or some other device capable of storing and transmitting program code 818.

In some examples, program code 18 may comprise be an operating system (OS) 850. Operating system 850, which may be stored on persistent storage 808, controls and allocates resources of data processing system 800. One or more applications 852 take advantage of the operating system's management of resources via program modules 854, and program data 856 stored on storage devices 816. OS 850 may include any suitable software system configured to manage and expose hardware resources of computer 800 for sharing and use by applications 852. In some examples, OS 850 provides application programming interfaces (APIs) that facilitate connection of different type of hardware and/or provide applications 852 access to hardware and OS services. In some examples, certain applications 852 may provide further services for use by other applications 852, e.g., as is the case with so-called "middleware." Aspects of present disclosure may be implemented with respect to various operating systems or combinations of operating systems.

The different components illustrated for data processing system 800 are not meant to provide architectural limitations to the manner in which different embodiments may be implemented. One or more embodiments of the present disclosure may be implemented in a data processing system that includes fewer components or includes components in addition to and/or in place of those illustrated for computer 800. Other components shown in FIG. 8 can be varied from the examples depicted. Different embodiments may be implemented using any hardware device or system capable of running program code. As one example, data processing system 800 may include organic components integrated with inorganic components and/or may be comprised entirely of organic components (excluding a human being). For example, a storage device may be comprised of an organic semiconductor.

In some examples, processor unit 804 may take the form of a hardware unit having hardware circuits that are specifically manufactured or configured for a particular use, or to produce a particular outcome or progress. This type of hardware may perform operations without needing program code 818 to be loaded into a memory from a storage device to be configured to perform the operations. For example, processor unit 804 may be a circuit system, an application specific integrated circuit (ASIC), a programmable logic device, or some other suitable type of hardware configured (e.g., preconfigured or reconfigured) to perform a number of operations. With a programmable logic device, for example, the device is configured to perform the number of operations and may be reconfigured at a later time. Examples of programmable logic devices include, a programmable logic array, a field programmable logic array, a field programmable gate array (FPGA), and other suitable hardware devices. With this type of implementation, executable instructions (e.g., program code 818) may be implemented as hardware, e.g., by specifying an FPGA configuration using a hardware description language (HDL) and then using a resulting binary file to (re)configure the FPGA.

In another example, data processing system 800 may be implemented as an FPGA-based (or in some cases ASIC-based), dedicated-purpose set of state machines (e.g., Finite State Machines (FSM)), which may allow critical tasks to be isolated and run on custom hardware. Whereas a processor such as a CPU can be described as a shared-use, general purpose state machine that executes instructions provided to it, FPGA-based state machine(s) are constructed for a special purpose, and may execute hardware-coded logic without sharing resources. Such systems are often utilized for safety-related and mission-critical tasks.

In still another illustrative example, processor unit 804 may be implemented using a combination of processors found in computers and hardware units. Processor unit 804 may have a number of hardware units and a number of processors that are configured to run program code 818. With this depicted example, some of the processes may be implemented in the number of hardware units, while other processes may be implemented in the number of processors.

In another example, system bus 802 may comprise one or more buses, such as a system bus or an input/output bus. Of course, the bus system may be implemented using any suitable type of architecture that provides for a transfer of data between different components or devices attached to the bus system. System bus 802 may include several types of bus structure(s) including memory bus or memory controller, a peripheral bus or external bus, and/or a local bus using any variety of available bus architectures (e.g., Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI)).

Additionally, communications unit 810 may include a number of devices that transmit data, receive data, or both transmit and receive data. Communications unit 810 may be, for example, a modem or a network adapter, two network adapters, or some combination thereof. Further, a memory may be, for example, memory 806, or a cache, such as that found in an interface and memory controller hub that may be present in system bus 802.

The flowcharts and block diagrams described herein illustrate the architecture, functionality, and operation of possible implementations of systems, methods, and computer program products according to various illustrative embodiments. In this regard, each block in the flowcharts or block diagrams may represent a module, segment, or portion of code, which comprises one or more executable instructions for implementing the specified logical function or functions. It should also be noted that, in some alternative implementations, the functions noted in a block may occur out of the order noted in the drawings. For example, the functions of two blocks shown in succession may be executed substantially concurrently, or the functions of the blocks may sometimes be executed in the reverse order, depending upon the functionality involved.

E. Additional Examples and Illustrative Combinations

This section describes additional aspects and features of predictive valve control systems and related methods, presented without limitation as a series of paragraphs, some or all of which may be alphanumerically designated for clarity and efficiency. Each of these paragraphs can be combined with one or more other paragraphs, and/or with disclosure from elsewhere in this application, in any suitable manner. Some of the paragraphs below expressly refer to and further limit other paragraphs, providing without limitation examples of some of the suitable combinations.

A0. A pressure control system comprising:
a plurality of inflatable objects, each of the inflatable objects having a respective pressure sensor and a respective inflation valve, wherein each of the inflation valves is controllable electrically and has a behavior profile predictive of an amount of current used by the valve when operated;
a valve controller having a pressure management circuit that receives pressure information from the pressure sensors and is configured to automatically maintain a respective selected pressure in each of the inflatable objects by issuing commands to operate the inflation valves;
wherein the valve controller further includes an electrical current management circuit configured to:
predict, based on the valve behavior profiles, what effect each of the commands issued by the pressure management circuit would have on a total current usage, when executed, and
automatically prevent any command that would cause the total current usage to exceed a maximum allowable current.

A1. The system of A0, further comprising a pressure source coupled to each of the inflation valves.

A2. The system of A0, wherein at least one of the inflation valves comprises a solenoid air control valve.

A3. The system of A2, wherein the solenoid air control valve is configured to fail in a shut position.

A4. The system of A0, wherein the electrical current management circuit is further configured to allow any command that would not cause the total current usage to exceed the maximum allowable current.

A5. The system of A4, wherein the allowed commands are passed to a device driver circuit configured to translate high-level commands into low-level commands suitable for actuators of the inflation valves.

A6. The system of A0, wherein, when a command to open a first inflation valve is prevented, the electrical current management circuit is configured to prevent a command to open a second inflation valve until another command to open the first inflation valve is allowed.

A7. The system of A6, wherein the electrical current management circuit stores identifying information regarding the first inflation valve.

A8. The system of A7, wherein the electrical current management circuit stores identifying information regarding the first inflation valve and the second inflation valve using a queue data structure.

B0. A spacecraft comprising:
a spacecraft frame;
a landing system coupled to the spacecraft frame and including a plurality of inflatable bags configured to reduce impact on the spacecraft frame during landing, each of the inflatable bags having a respective pressure sensor and a respective inflation valve, wherein each of the inflation valves is controllable electrically and has a behavior profile predictive of an amount of current used by the valve when operated;
a valve controller having a pressure management circuit configured to receive pressure information from the pressure sensors and to automatically maintain a respective selected pressure in each of the inflatable bags by issuing commands to operate the inflation valves;
wherein the valve controller further includes an electrical current management circuit configured to:
predict, based on the valve behavior profiles, what effect each of the commands issued by the pressure management circuit would have on a total current usage, when executed, and
automatically prevent any command that would cause the total current usage to exceed a maximum allowable current.

B1. The spacecraft of B0, wherein the electrical current management circuit is implemented as one or more state machines and associated logic in a field programmable gate array (FPGA) circuit.

B2. The spacecraft of B1, wherein the electrical current management circuit operates at a clock speed that is at least an order of magnitude faster than the pressure management circuit.

B3. The system of B0, wherein the electrical current management circuit is further configured to allow any command that would not cause the total current usage to exceed the maximum allowable current.

B4. The system of B3, wherein the allowed commands are passed to a device driver circuit configured to translate high-level commands into low-level commands suitable for actuators of the inflation valves.

B5. The system of B0, wherein, when a command to open a first inflation valve is prevented, the electrical current management circuit is configured to prevent a command to open a second inflation valve until another command to open the first inflation valve is allowed.

B6. The system of B5, wherein the electrical current management circuit stores identifying information regarding the first inflation valve.

B7. The system of B6, wherein the electrical current management circuit stores identifying information regarding the first inflation valve and the second inflation valve in a queue data structure.

C0. A method for controlling pressure without exceeding a maximum allowable electrical current, the method comprising:

controlling a plurality of inflation valves coupled to a plurality of respective inflatable objects using a valve controller, wherein each of the inflatable objects has a respective pressure sensor and each of the inflation valves has a behavior profile predictive of an amount of current used by the valve when operated;

receiving, at a pressure management circuit of the valve controller, pressure information from the pressure sensors;

automatically maintaining a respective selected pressure in each of the inflatable objects by issuing commands, using the pressure management circuit, to operate the inflation valves;

predicting, using the electrical current management circuit and based on the valve behavior profiles, what effect each of the commands issued by the pressure management circuit would have on a total current usage, when executed; and automatically preventing, using the electrical current management circuit, any command that would cause the total current usage to exceed a maximum allowable current.

C1. The method of C0, wherein at least one of the inflation valves comprises a solenoid air control valve.

C2. The method of C1, wherein the solenoid air control valve is configured to fail in a shut position.

C3. The method of C0, further comprising:

allowing, using the electrical current management circuit, any command that would not cause the total current usage to exceed the maximum allowable current.

C4. The method of C5, wherein the allowed commands are passed to a device driver circuit configured to translate high-level commands into low-level commands suitable for actuators of the inflation valves.

C5. The method of C0, further comprising:

in response to prevention of a command to open a first inflation valve, preventing a command to open a second inflation valve until another command to open the first inflation valve is allowed.

C6. The method of C5, further comprising:

storing identifying information regarding the first inflation valve.

C7. The method of C6, further comprising storing identifying information regarding the second inflation valve, wherein the identifying information regarding the first inflation valve and the second inflation valve are stored using a queue data structure.

C8. The method of C0, wherein the electrical current management circuit is implemented as one or more state machines and associated logic in a field programmable gate array (FPGA) circuit.

C9. The method of C8, wherein the electrical current management circuit operates at a clock speed that is at least an order of magnitude faster than the pressure management circuit.

D0. A system comprising:

a plurality of controllable devices each configured to affect a measurable characteristic of a respective portion of a mechanical system, each of the controllable devices having a respective sensor configured to sense the measurable characteristic of the associated portion of the system, wherein each of the controllable devices has a behavior profile predictive of an amount of current used by the device when operated;

a device controller having a measurable characteristic management circuit configured to receive information from the sensors and to automatically maintain a respective selected magnitude of the characteristic in each of the portions of the system by issuing commands to operate the devices;

wherein the device controller further includes an electrical current management circuit configured to:

receive each of the commands issued by the measured characteristic management circuit, predict, based on the device behavior profiles, what effect the command would have on a total current usage, if executed, and prevent any command that would cause the total current usage to exceed a maximum allowable current.

D1. The system of D0, wherein the measurable characteristic is adherence by a missile to a selected flight path, the controllable devices are hydraulic valves, and the portions of the system affected by the hydraulic valves are control surfaces of airfoils configured to steer the missile.

D2. The system of D0, wherein the measurable characteristic is air pressure, the controllable devices are inflation valves coupled to a pressure source, and the portions of the system affected by the inflation valves are inflatable air bags.

Advantages, Features, Benefits

The different embodiments and examples of the predictive valve control system described herein provide several advantages over known solutions for preventing overcurrent conditions in critical systems. For example, illustrative embodiments and examples described herein allow active management of current usage in an operating environment without the use of feedback devices and measurement systems.

Additionally, and among other benefits, illustrative embodiments and examples described herein eliminate the need for engineered-in overcapacity, thereby allowing the use of a lower capacity power supply. This saves weight in the power supply and generation systems. Procurement cost is also reduced.

Additionally, and among other benefits, illustrative embodiments and examples described herein lessen interconnect and logic design costs, because the need for a feedback path and measurement hardware is eliminated.

No known system or device can perform these functions, particularly in mission-critical situations, such as spacecraft systems. However, not all embodiments and examples described herein provide the same advantages or the same degree of advantage.

CONCLUSION

The disclosure set forth above may encompass multiple distinct examples with independent utility. Although each of these has been disclosed in its preferred form(s), the specific embodiments thereof as disclosed and illustrated herein are not to be considered in a limiting sense, because numerous variations are possible. To the extent that section headings are used within this disclosure, such headings are for organizational purposes only. The subject matter of the disclosure includes all novel and nonobvious combinations and subcombinations of the various elements, features, functions, and/or properties disclosed herein. The following claims particularly point out certain combinations and subcombinations regarded as novel and nonobvious. Other combinations and subcombinations of features, functions, elements, and/or properties may be claimed in applications claiming priority from this or a related application. Such claims, whether broader, narrower, equal, or different in scope to the original claims, also are regarded as included within the subject matter of the present disclosure.

What is claimed is:

1. A pressure control system comprising: a plurality of inflatable objects, each of the inflatable objects having a respective pressure sensor and a respective inflation valve, wherein each of the inflation valves is controllable electrically and has a behavior profile predictive of an amount of current used by the valve when operated; and
a valve controller having a pressure management circuit that receives pressure information from the pressure sensors and is configured to automatically maintain a respective selected pressure in each of the inflatable objects by issuing commands to operate the inflation valves;
wherein the valve controller further includes an electrical current management circuit configured to:
predict, based on the valve behavior profiles, what effect each of the commands issued by the pressure management circuit would have on a total current usage, when executed, and
automatically prevent any command that would cause the total current usage to exceed a maximum allowable current;
wherein the electrical current management circuit operates at a clock speed that is at least an order of magnitude faster than the pressure management circuit.

2. The system of claim 1, further comprising a pressure source coupled to each of the inflation valves.

3. The system of claim 1, wherein at least one of the inflation valves comprises a solenoid air control valve configured to fail in a shut position.

4. The system of claim 1, wherein the electrical current management circuit is further configured to allow any command that would not cause the total current usage to exceed the maximum allowable current.

5. The system of claim 1, wherein, when a command to open a first inflation valve is prevented, the electrical current management circuit is configured to prevent a command to open a second inflation valve until another command to open the first inflation valve is allowed.

6. The system of claim 1, wherein the electrical current management circuit is implemented as one or more state machines and associated logic in a field programmable gate array (FPGA) circuit.

7. A spacecraft comprising:
a spacecraft frame;
a landing system coupled to the spacecraft frame and including a plurality of inflatable bags configured to reduce impact on the spacecraft frame during landing, each of the inflatable bags having a respective pressure sensor and a respective inflation valve, wherein each of the inflation valves is controllable electrically and has a behavior profile predictive of an amount of current used by the valve when operated; and
a valve controller having a pressure management circuit configured to receive pressure information from the pressure sensors and to automatically maintain a respective selected pressure in each of the inflatable bags by issuing commands to operate the inflation valves;
wherein the valve controller further includes an electrical current management circuit configured to:
predict, based on the valve behavior profiles, what effect each of the commands issued by the pressure management circuit would have on a total current usage, when executed, and
automatically prevent any command that would cause the total current usage to exceed a maximum allowable current;
wherein the electrical current management circuit operates faster than the pressure management circuit.

8. The spacecraft of claim 7, wherein the electrical current management circuit is implemented as one or more state machines and associated logic in a field programmable gate array (FPGA) circuit.

9. The spacecraft of claim 8, wherein the electrical current management circuit operates at a clock speed that is at least an order of magnitude faster than the pressure management circuit.

10. The system of claim 7, wherein the electrical current management circuit is further configured to allow any command that would not cause the total current usage to exceed the maximum allowable current.

11. The system of claim 7, wherein, when a command to open a first inflation valve is prevented, the electrical current management circuit is configured to prevent a command to open a second inflation valve until another command to open the first inflation valve is allowed.

12. A method for controlling pressure without exceeding a maximum allowable electrical current, the method comprising:
controlling a plurality of inflation valves coupled to a plurality of respective inflatable objects using a valve controller, wherein each of the inflatable objects has a respective pressure sensor and each of the inflation valves has a behavior profile predictive of an amount of current used by the valve when operated;
receiving, at a pressure management circuit of the valve controller, pressure information from the pressure sensors;
automatically maintaining a respective selected pressure in each of the inflatable objects by issuing commands, using the pressure management circuit, to operate the inflation valves;
predicting, using an electrical current management circuit and based on the valve behavior profiles, what effect each of the commands issued by the pressure management circuit would have on a total current usage, when executed; and automatically preventing, using the electrical current management circuit, any command that would cause the total current usage to exceed a maximum allowable current wherein the electrical current management circuit operates at a clock speed that is at least an order of magnitude faster than the pressure management circuit.

13. The method of claim 12, wherein the electrical current management circuit tracks a time wise status of the inflation valves, and sums resulting current values to determine the total current usage.

14. The method of claim 12, wherein at least one of the inflation valves comprises a solenoid air control valve configured to fail in a shut position.

15. The method of claim 12, further comprising:
allowing, using the electrical current management circuit, any command that would not cause the total current usage to exceed the maximum allowable current.

16. The method of claim 15, wherein the allowed commands are passed to a device driver circuit configured to translate high-level commands into low-level commands suitable for actuators of the inflation valves.

17. The method of claim 12, further comprising:
in response to prevention of a command to open a first inflation valve, preventing a command to open a second inflation valve until another command to open the first inflation valve is allowed.

18. The method of claim 17, further comprising:
storing identifying information regarding the first inflation valve.

19. The method of claim 18, further comprising storing identifying information regarding the second inflation valve, wherein the identifying information regarding the first inflation valve and the second inflation valve are stored using a queue data structure.

20. The method of claim 12, wherein the electrical current management circuit is implemented as one or more state machines and associated logic in a field programmable gate array (FPGA) circuit.

* * * * *